OSCILLATOR WITH SEPARATE VOLTAGE CONTROLS
FOR NARROW AND WIDE RANGE TUNING

Filed May 22, 1967 2 Sheets-Sheet 1

INVENTORS.
FREDERICK W. KRUSE JR.
DOUGLAS L. BASKINS
BY Jack M. Wiener
ATTORNEY

INVENTORS.
FREDERICK W. KRUSE JR.
DOUGLAS L. BASKINS
BY Jack M. Wiseman
ATTORNEY

United States Patent Office 3,397,365
Patented Aug. 13, 1968

3,397,365

OSCILLATOR WITH SEPARATE VOLTAGE CONTROLS FOR NARROW AND WIDE RANGE TUNING

Frederick W. Kruse, Jr., Palo Alto, and Douglas L. Baskins, Cupertino, Calif., assignors to Kruse-Storke Electronics, Mountain View, Calif., a corporation of California Filed May 22, 1967, Ser. No. 640,135
17 Claims. (Cl. 331—102)

ABSTRACT OF THE DISCLOSURE

A voltage-tunable oscillator in which two pairs of variable-capacitance diodes, connected back-to-back, are symmetrically disposed in a transmission line. The transmission line is symmetrically located in a hollow rectangular transmission line structure to form a resonant circuit which is excited at the fundamental resonator frequency by a pair of transistor amplifiers driving the transmission line in push-pull relationship. The oscillation frequency is varied over a wide range by the application of a first tuning voltage to the junction between the two diodes of each pair of diodes; and the oscillation frequency is varied over a lesser range by the application of a second tuning voltage to the junction between the two pairs of diodes.

The present invention relates in general to oscillators, and more particularly to a voltage-tuned oscillator.

In the copending application of F. W. Kruse, Jr., F. P. Storke, Jr. and D. L. Baskins, Ser. No. 537,427, filed Mar. 25, 1966, and now Patent No. 3,377,568, there is disclosed and claimed a voltage-tuned oscillator in which variable-capacitance diodes are connected back-to-back in a hollow rectangular transmission line structure. The assignee of the present application is also the assignee of the aforementioned pending application. The tuning line and diodes form a resonant load circuit for a transistor oscillator so that the application of a variable bias voltage to said diodes changes the oscillation frequency of said oscillator. The present invention particularly enables improved operation in a voltage-tuned oscillator of this type.

One object of the present invention is the attainment, in an oscillator of the type in which the resonant load comprises a transmission line symmetrically disposed within a hollow transmission line structure, of enhanced power output at the fundamental frequency of the resonant load. Generally, this object is accomplished by the provision of a pair of amplifiers which drive the transmission line in push-pull relationship.

Another object of the present invention is to permit a voltage-tuned oscillator to be tuned over both a wide range for purposes of frequency sweeping and over a narrow range for purposes of phase-locking and automatic frequency control. Generally, this object is accomplished by the provision of a tuned load circuit having two pairs of variable-capacitance diodes in which all four diodes are varied for wide range tuning and only two of the diodes are varied for lesser range tuning.

Another object of the present invention is to provide an oscillator with a push-pull configuration to reduce harmonic distortion in the output waveform.

The various features and advantages of the present invention will become more apparent upon a consideration of the following description, taken in connection with the accompanying drawing, wherein.

Figure 1:
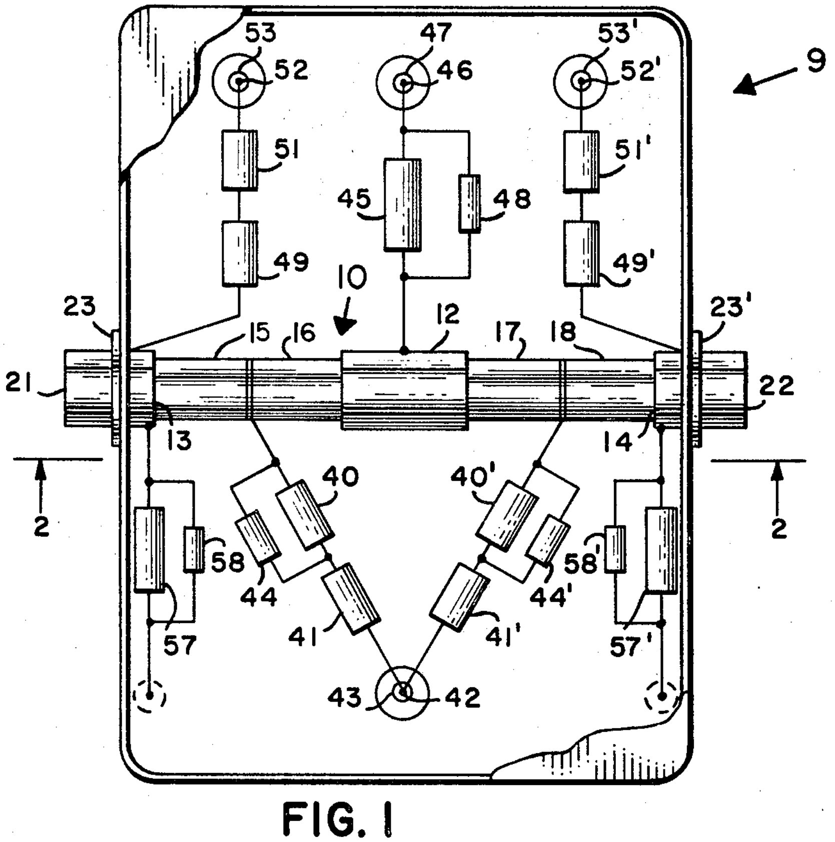
FIGURE 1 is a diagrammatic top plan view of an oscillator embodying the present invention with the top cover of a hollow rectangular transmission line structure thereof removed.
Figure 2:
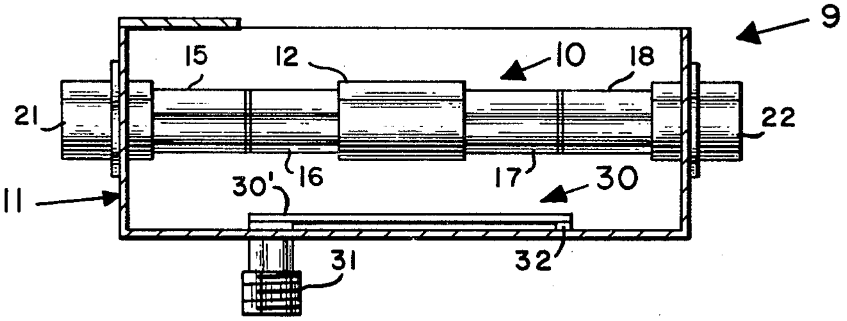
FIGURE 2 is a diagrammatic cross-sectional view taken along line 2—2 in FIGURE 1.

Illustrated in FIGURES 1 and 2 is the voltage tuned oscillator 9 of the present invention which comprises a tuning transmission line 10 that is disposed along an axis of transmission line symmetry within a rectangular hollow transmission line structure or housing 11. The tuning transmission line 10 extends between the front and rear walls of the transmission line structure 11 midway of the top and bottom walls as seen in FIGURE 2 and midway of the side walls as seen in FIGURE 1. This symmetrical disposition permits the excitation of the fundamental frequency in a push-pull mode of operation in the transmission line structure 11. The push-pull configuration serves to reduce harmonic distortion in the output waveform. The tuning line 10 comprises an inductive central metallic sleeve 12 and inductive end metallic sleeves 13 and 14. Supported between the central sleeve 12 and the sleeve 13 is a first pair of back-to-back variable-capacitance diodes 15 and 16; and supported between the central sleeve 12 and the end sleeve 14 is a second pair of back-to-back variable-capacitance diodes 17 and 18. The inner diodes 16 and 17 of each pair are also back-to-back. This arrangement of the diodes maintains the symmetry of the line 10 to insure the dominance of excitation at the fundamental frequency of the transmission line structure 11.

A transistor amplifier 21 (FIG. 1) is mounted outside the front wall of the transmission line structure 11; and a second transistor amplifier 22 is mounted outside the rear wall of the transmission line structure 11. The tuning line 10 provides a tuned load for the amplifiers 21 and 22 which are operating in push-pull relationship, whereby oscillations are established at an R.F. frequency determined by the reactive impedance of line 10. The application of tuning voltages to the diodes 15, 16, 17 and 18 changes the capacitive reactance thereof. This action changes the net reactance of the transmission line, and, hence, the oscillation frequency. Suitable insulation, such as Mylar, is disposed around the case of the transistors 21 and 22 to form collector by-pass capacitances 23 and 23' (FIGURES 2 and 3) to the grounded cavity resonator wall.

As seen in FIGURE 2, a transversely-extending shorted strip-line loop coupler 30 made, for example, of an epoxy sheet copper-clad on the inwardly-facing surface to form an insulated conducting strip 30' is attached to the bottom wall of the transmission line structure 11 directly below the center sleeve 12 of the tuning line 10. An R.F. output coaxial connector 31 is mounted on the bottom surface of the transmission structure 11 with the outer conductor of the coaxial connector 31 contacting the resonator wall and the inner conductor of the coaxial connector 31 contacting the conducting inwardly-facing surface 30' of the stripline coupler 30 at one end thereof. The opposite end of the stripline coupler 30 is shorted to the transmission line structure 11 by a conducting connection 32. The coupler 30 serves to obtain the R.F. output power, and by adjustment of its geometry permits simple adjustment of the R.F. output level.

Figures 3, 4:
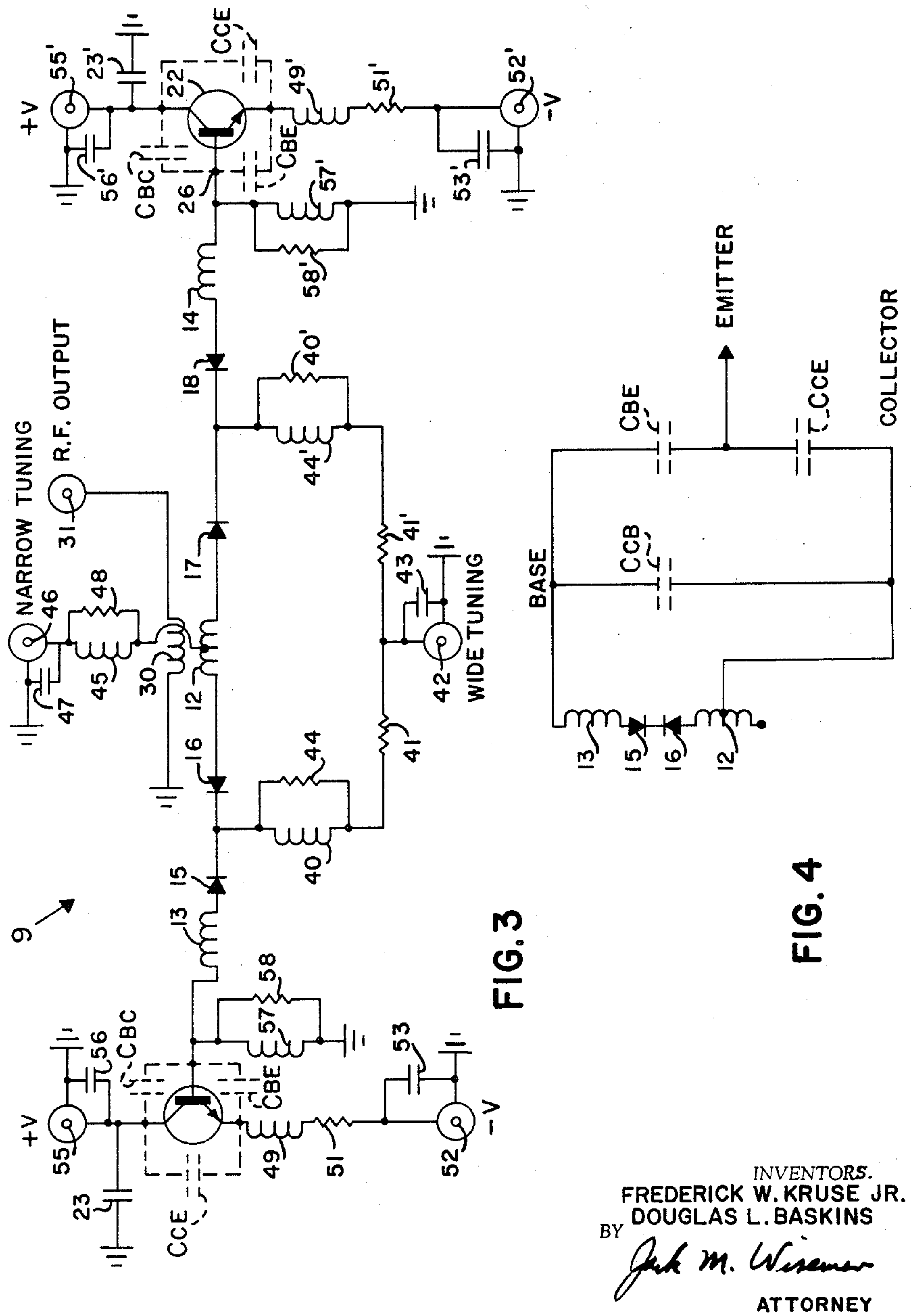
FIGURE 3 is a schematic circuit diagram of the oscillator of FIGURE 1.
FIGURE 4 is a diagrammatic illustration of the basic tuned circuit for one-half of the oscillator shown in FIGURES 1–3.

FIGURE 1 shows the manner in which the oscillator circuit elements are physically disposed inside the transmission line structure 11; and FIGURE 3 is a schematic circuit diagram from which the operation of the embodiment of FIGURE 1 will be readily understood. It should be noted that the transmission line structure 11 is maintained at a ground reference potential.

Connected in series with the junction between the pairs of diodes 15, 16 and 17, 18 are an R.F. choke coil 40 and 40', respectively, and balancing resistors 41 and 41', respectively, which resistors are connected to a common D.C. input terminal 42 externally of the transmission line structure 11 through an R.F. by-pass capacitance 43. In use, a source of voltage for wide-range tuning is connected to the input terminal 42. The value of the balancing resistors 41 and 41' are adjusted to match the characteristics of the associated pair of diodes so that the application of the tuning voltage to the terminal 42 produces a symmetrical effect on each pair of diodes. Damping resistors 44 and 44' are connected in parallel with the choke coils 40 and 40', respectively to inhibit spurious modes of oscillation.

Connected in series with the central sleeve 12 is an R.F. choke coil 45, which is connected to a D.C. input terminal 46 externally of the transmission line structure 11 through an R.F. by-pass capacitance 47. In use, a source of voltage for narrow-range tuning is connected to the input terminal 46. A damping resistor 48 is connected in parallel with the choke coil 45 also to inhibit spurious modes of oscillation. The coil 45 and the resistor 48 compensate for any unbalance that may exist in oscillator due to component tolerances by reducing unbalance currents.

In series with the emitter of each of the transistors 21 and 22, respectively, are an R.F. choke coil 49 and a resistor 51, and an R.F. choke coil 49' and a resistor 51', which resistors are connected, respectively, to D.C. input terminals 52 and 52' externally of the transmission line structure 11 through R.F. by-pass capacitances 53 and 53' respectively. A negative bias voltage (—V) for the transistors 21 and 22 is applied to the terminals 52 and 52', respectively. A positive bias voltage (+V) for the collectors of the transistors 21 and 22 is applied to D.C. input terminals 55 and 55' which are connected externally of the transmission line structure 11 through R.F. by-pass capacitances 56 and 56', respectively. The value of the resistors 51 and 51' regulates the D.C. current in the transistors 21 and 22, respectively. Further, by mounting the resistors 51 and 51' within the transmission line structure 11, the feed through capacitance 53 does not become changed during the R.F. cycle and, therefore, relaxation oscillations are eliminated.

Connected between the end sleeves 13 and 14 of the tuning line 10 and the grounded transmission line structure 11 are R.F. choke coils 57 and 57', respectively. Damping resistors 58 and 58', which are disposed adjacent to the choke coil 57 and 57', respectively, are connected in parallel with the choke coils 57 and 57', respectively. The damping resistors 58 serve to reduce oscillations at spurious modes. Without these damping resistors there is a tendency for spurious mode oscillations to occur. The damping resistors 58 adjust circuit losses to offset excess transistor gain for best wave form and to eliminate multi-moding.

By employment of the rectangular transmission line structure 11, the R.F. choke coils 40, 40', 45, 49, 49', 57 and 57' are located in the low field region so that the coupling impedances of the choke coils are minimized thereby eliminating the effect of the spurious resonances from the choke coils in the oscillator.

For wide-range tuning, the capacitance of the variable-capacitance diodes 15, 16, 17 and 18 is controlled by the voltage applied to the terminal 42, which typically ranges from —.7 to +65 volts. To produce oscillations, the collector-emitter potential of the transistors 21 and 22 must be equal to or in excess of the base-emitter potential, and the base-collector impedance should be reactive of opposite sign with respect to the base-emitter impedance and the collector-emitter impedance.

During the operation of the oscillator 9, the tuning line segments 12, 13 and 14 and the variable-capacitance diodes 15, 16, 17 and 18 are in series (FIG. 3). The tuning line segments 12, 13 and 14 along with the diodes 15–18 connected in series therewith are in parallel with the combined interelectrode capacitance of the base and collector of the transistors 21 and 22 and the transistor case. The just-mentioned parallel circuit is in parallel with the series combination of inter-electrode capacitance of the base and emitter, and collector and emitter, of the transistors 21 and 22. The line segments 12–14, the diodes 15–18, the collector-base interelectrode capacitance of the transistors 20 and 21 and the base-emitter and collector-emitter interelectrode capacitance of the transistors 20 and 21 form the tuned output circuit (FIG. 3) which determines the generating frequency of the oscillator 9.

In selecting the generating frequency of the oscillator 9, the capacitance of the diodes 15, 16, 17 and 18 varies inversely with the magnitude of the reverse bias voltage applied thereto. The tuning line segments 12, 13 and 14 and the diodes 15, 16, 17 and 18 at the lower end of the frequency band for the oscillator 9 take on the characteristic of an inductive network. The application of a forward bias on the diodes 15, 16, 17 and 18 produces a low resistance and the tuning line segments 12–14 in parallel with the collector-emitter interelectrode capacitance resonate with the base-emitter and collector-emitter interelectrode capacitances of the transistors 21 and 22. The tuned output circuit for the oscillator 9 at the upper end of the frequency band also takes on the characteristics of an inductive network. A reverse bias application to the variable-capacitance diodes 15, 16, 17 and 18 renders the capacitance of these diodes in series with the tuning line segments 12–14 and the base lead inductances. The net inductive reactance is thereby reduced causing an increase in the oscillation frequency.

Over the wide tuning range, corresponding to the variation of the tuning voltage at this terminal 42 over the range of, for example, —.7 to +65 volts, the diodes 15, 16, 17 and 18 operate in three distinct regions. At the low end of the frequency range, the diodes 15–18 are biased for full forward conduction so as to present a very low resistance. The lowest frequency of oscillation is determined by the physical length of the transmission line 10 in combination with the lead inductances and the transistor electrode capacitances. As the tuning voltage is increased in the positive direction, the diodes 15–18 pass into the rectification or intermediate frequency region where the bias is between the full forward conduction voltage and the reversed peak voltage of the R.F. voltage across the diodes 15–18. In this region, the reactive impedance of the circuit, and hence, the oscillation frequency, changes as a function of both the capacitance of the diodes and the current exchange during the conducting or rectification portion of the R.F. cycle. In the rectification region, the reactance of the circuit is changed primarily by varying the current flow interval over the R.F. cycle and hence, the average R.F. current. In this manner, the fixed external reactances of the circuit appear to vary, since for a given R.F. voltage, the current changes. Finally, when the positive tuning voltage is increased to the point where the reverse-bias on the diodes 15–18 is greater than the value of the peak R.F. voltage across the diodes, the diodes 15–18 function solely as variable capacitors whose capacitance varies inversely with the tuning voltage.

The oscillator 9 of the present invention, in addition to providing wide tuning, also permits narrow-range changes in the oscillation frequency to be made by the application of a voltage to the terminal 46. This voltage changes the bias voltage across the inner diodes 16 and 17 only and thus produces a smaller change in oscillation frequency for each one volt change in tuning voltage. For example, in a typical embodiment, the wide-range tuning voltage applied to the terminal 42 changes the oscillation frequency from 940 to 2060 mHz. as this voltage is varied from −0.7 to +65 volts; and the narrow-range tuning voltage applied to the terminal 46 changes the oscillation frequency at 1000 mHz. by 90 mHz. per volt, and the oscillation frequency at 2000 mHz. by 3 mHz. per volt. Typically, the narrow-range tuning voltage will vary from +.7 to −65 volts relative to the wide-range tuning voltage. Thus, for example, gross changes in oscillation frequency are made by the application of a sweep signal to the wide-range tuning terminal 42, and a modulation signal is applied to the narrow-range tuning terminal 46 for purposes of phase-locking and automatic frequency control.

It is to be understood that modifications and variations of the embodiments of the invention disclosed herein may be resorted to without departing from the spirit of the invention and scope of the appended claims.

Having thus described our invention, what we claim as new and desire to protect by Letters Patent is:

1. In an oscillator, the combination comprising: a plurality of voltage-variable impedance elements for determining the frequency of oscillation; means applying a first voltage to all of said elements for varying the oscillation frequency over a wide range; and means applying a second voltage to less than all of said elements for varying the oscillation frequency over a lesser range.

2. The combination of claim 1 whereas said impedance elements are variable capacitance diodes.

3. The combination of claim 1 wherein said impedance elements comprise two pairs of variable-capacitance diodes, said first voltage is applied to all four of said diodes, and said second voltage is applied to only one diode of each pair.

4. The combination of claim 3 wherein said diodes are disposed in a transmission line, and said transmission line is disposed along an axis of transmission line symmetry of a hollow transmission line structure.

5. The combination of claim 4 wherein the two diodes of each pair of diodes are connected in back-to-back relationship, the two pairs of diodes are connected in back-to-back relationship, said first voltage is applied to the junction of said two diodes of each pair of diodes, and said second voltage is applied to the junction of said two pairs of diodes.

6. The combination of claim 2 wherein said diodes are disposed in a transmission line, and said transmission line is disposed along an axis of transmission line symmetry of a hollow transmission line structure.

7. An oscillator, comprising: a symmetrical transmission line housing; a tuning line disposed along an axis of transmission symmetry of said housing; impedance means symmetrically disposed in said tuning line for forming a tuning circuit therewith; and a pair of amplifiers for driving said tuning line in push-pull relationship, said tuning line and said variable impedance means providing a resonant load for said amplifiers for generating a signal.

8. An oscillator according to claim 7, further including an output device coupled to said tuning line for receiving said generated signal.

9. An oscillator according to claim 7 further including means for varying the impedance of said impedance means to thereby change the frequency of said generated signal.

10. An oscillator according to claim 9 wherein: said impedance means includes a plurality of voltage-variable impedance elements for determining the frequency of said generated signal; and said impedance varying means includes means applying a first voltage to all of said elements for varying the oscillation frequency over a wide range; and means applying a second voltage to less than all of said elements for varying the oscillation frequency over a lesser range.

11. An oscillator according to claim 10 wherein said impedance elements comprise two pairs of variable-capacitance diodes, said first voltage is applied to all four of said diodes, and said second voltage is applied to only one diode of each pair.

12. An oscillator according to claim 11 wherein the two diodes of each pair of diodes are connected in back-to-back relationship, the two pairs of diodes are connected in back-to-back relationship, said first voltage is applied to the junction of said two diodes of each pair of diodes, and said second voltage is applied to the junction of said two pairs of diodes.

13. An oscillator as claimed in claim 10 wherein said impedance elements are variable-capacitance diodes.

14. An oscillator comprising a symmetrical transmission line housing, a tuning line disposed along an axis of transmission symmetry of said housing, variable capacitance diodes symmetrically disposed in said tuning line for forming a tuning circuit therewith, means for driving said tuning circuit in a push-pull mode, and tuning voltage means for applying a tuning voltage to said diodes of sufficient magnitude to pass said diodes into a rectification mode for varying the reactive impedance of said tuning circuit, whereby the oscillation frequency of said oscillator is in an intermediate frequency region and varies as a function of the capacitance of said diodes and the current exchange during the conduction of said diodes.

15. An oscillator as claimed in claim 14 wherein said tuning voltage means applies a tuning voltage to said diodes of a magnitude less than the tuning voltage applied to said diodes to pass the same into said rectification mode for biasing said diodes for full forward conduction, said diodes thereby present a low resistance in said tuning circuit, whereby the oscillating frequency of said oscillator is in a low frequency region and varies as a function of the length of said tuning line.

16. An oscillator as claimed in claim 14 wherein said tuning voltage means applies a tuning voltage to said diodes of a magnitude greater than the tuning voltage applied to said diodes to pass the same into said rectification mode for reverse biasing said diodes at a biasing potential greater than the peak radio freqeuncy voltage appearing across said diodes from generated oscillating frequencies, said diodes thereby function as variable capacitors with the capacitance thereof varying inversely with said applied tuning voltage, whereby the oscillating frequency for said oscillator is in a high frequency region and varies as a function of said applied tuning voltage.

17. An oscillator as claimed in claim 15 wherein said tuning voltage means applies a tuning voltage to said diodes of a magnitude greater than the tuning voltage applied to said diodes to pass the same into said rectification mode for reverse biasing said diodes at a biasing potential greater than the peak radio frequency voltage appearing across said diodes from generated oscillating frequencies, said diodes thereby function as variable capacitors with the capacitance thereof varying inversely with said applied tuning voltage, whereby the oscillating frequency for said oscillator is in a high frequency region and varies as a function of said applied tuning voltage, said rectification mode for said intermediate region employs an applied tuning voltage for said diodes of a magnitude to apply a biasing potential to said diodes between said full forward conduction biasing potential and said reversed peak voltage of the radio frequency voltage appearing across said diodes.

References Cited

UNITED STATES PATENTS 3,067,394 12/1962 Zimmerman et al. ----- 333—17

ROY LAKE, *Primary Examiner.*

S. H. GRIMM, *Assistant Examiner.*